United States Patent [19]
Koelling et al.

[11] Patent Number: 5,502,671
[45] Date of Patent: Mar. 26, 1996

[54] APPARATUS AND METHOD FOR A SEMICONDUCTOR MEMORY CONFIGURATION-DEPENDENT OUTPUT BUFFER SUPPLY CIRCUIT

[75] Inventors: Jeffrey E. Koelling, Dallas; Hugh P. McAdams, McKinney, both of Tex.

[73] Assignee: Texas Instruments Incorporated, Dallas, Tex.

[21] Appl. No.: 298,827

[22] Filed: Aug. 31, 1994

[51] Int. Cl.$^6$ .................................................. G11C 7/02
[52] U.S. Cl. ............... 365/189.09; 365/149; 365/189.11; 365/189.05
[58] Field of Search .............................. 365/189.09, 149, 365/189.05, 189.11, 226; 327/589, 390, 534, 535, 536, 537

[56] References Cited

U.S. PATENT DOCUMENTS

| | | | |
|---|---|---|---|
| 4,964,082 | 10/1990 | Sato et al. | 365/189.09 |
| 5,072,134 | 12/1991 | Min | 327/537 |
| 5,258,956 | 11/1993 | Ahn et la. | 365/149 |
| 5,304,859 | 4/1994 | Arimoto | 327/535 |

*Primary Examiner*—David C. Nelms
*Assistant Examiner*—Vu A. Le
*Attorney, Agent, or Firm*—Richard L. Donaldson; Leo N. Heiting; William W. Holloway

[57] ABSTRACT

In a dynamic random access memory in which the number of data buffers is selectable, a buffer supply can be configured by a control signal to provide pump charge capacitance which is appropriate for providing the power required for energizing the selected number of buffers. In response to an external control signal, a second capacitor (or capacitor bank) can be precharged and then applied to the output terminal of buffer supply simultaneously with the precharging and application of the charge on the first capacitor. The dimension of the first capacitor is suitable for a buffer supply for the first buffer configuration and the second capacitor is suitable for a buffer supply for additional buffer amplifiers of the second configuration.

9 Claims, 4 Drawing Sheets

APPARATUS AND METHOD FOR A SEMICONDUCTOR MEMORY CONFIGURATION-DEPENDENT OUTPUT BUFFER SUPPLY CIRCUIT

BACKGROUND OF THE INVENTION

1. Field of the Invention

This invention is generally related to semiconductor memories and, more particularly, to dynamic random access memories (DRAMs) in which the configuration (or number) of output data buffers can be varied.

2. Description of the Related Art

In the related art, dynamic random access memories with n-channel metal oxide semiconductor (NMOS) output buffers can be provided with a variable number of output buffers. The output buffer supply circuit providing the voltage, generally referred to as Vpp, has a single sized pumping capacitor for both a one output buffer and a four output buffer configuration. The NMOS output buffer provides both the pull-up function and the pull-down function of the data bus external to the integrated circuit. When the pull-up transistor (133 in FIG. 1) is required to drive a high voltage level to the data bus, the gate terminal of the pull-up transistor must have a booted voltage applied thereto. This booted voltage is referred to as the Vpp voltage and is generated within the dynamic random access memory unit. Using a bond pad option during the fabrication process, the dynamic random access memory can be configured as a one buffer memory unit or as a four buffer memory unit.

Referring to FIG. 1, a schematic diagram of a buffer circuit which is used in conjunction with a buffer supply circuit is shown. The WOEN_ signal is coupled to first terminal and a gate terminal of n-channel transistor 103, and to a gate terminal of n-channel transistor 109. The WOEN signal is coupled to a gate terminal of n-channel transistor 101. The WOE3_ signal is coupled to a first terminal of transistor 101 and to a gate terminal of transistor 111. A first terminal of transistor 109 is coupled to ground. A first terminal of transistor 111 is coupled to ground, while a second terminal of transistor 111 is coupled to a second terminal of transistor 109, a first terminal of p-channel transistor 107, a gate terminal of p-channel 105, a gate terminal of p-channel transistor 123, a gate terminal of n-channel transistor 124, a gate terminal of p-channel transistor 125 and a gate terminal of n-channel transistor 127. A second terminal of transistor 101 is coupled to a second terminal of transistor 103, a first terminal of transistor 105, and to the gate terminal of transistor 107. The WDLAT signal is coupled to a first terminal of CMOS pass gate transistor 117 and to an input of inverter amplifier 115. The output terminal of inverter 115 is coupled to a second terminal of pass gate transistor 117. The IOMUX3 signal is coupled to an output terminal of pass gate transistor 117, to an input terminal of inverter amplifier 119 and to a first terminal of transistor 127. The output terminal of inverter amplifier 119 is coupled to an input terminal of inverter amplifier 121 and to a first terminal of transistor 124. The output terminal of inverter amplifier 121 is coupled to an input terminal of pass gate transistor 117. The second terminal of transistor 127 is coupled to a first terminal of transistor 125 and to a first terminal of NOR gate 131. A first terminal of transistor 124 is coupled to a first terminal of transistor 123 and to a first terminal of NOR gate 129. An output terminal of NOR gate 129 is coupled to a second input terminal of NOR gate 131 and is coupled through resistor 135 to the gate terminal of n-channel transistor 133 and a first terminal of transistor 132. The output terminal of NOR gate 131 is coupled to a second input terminal of NOR gate 129 and to a gate terminal of n-channel transistor 139. A first terminal of transistor 139 is coupled to the common potential, while a second terminal of transistor 139 is coupled through resistor 137 to the output terminal of the buffer circuit, to a second terminal of transistor 132 and to a first terminal of transistor 133. The second terminal of transistor 133 is coupled to the Vex terminal. The Vpp terminal is coupled to the power terminal of NOR gate 131, to the power terminal of NOR gate 129, to a second terminal of transistor 125, to the second terminal of transistor 123, to the second terminal of transistor 107 and to the second terminal of transistor 105. The three buffer amplifiers which are added to the initial single amplifier have the same schematic diagram. The differences are that the WOFX4 signal is used in place of The WOE3_ signal and the IOPRBN(N=0–2) replaces the IOMUX3 signal. This buffer circuit receives an input signal IOMUX3 (or IOPRBN), buffers the signal, and applies the buffered signal to DQ3 (DQN) terminal.

Referring next to FIG. 2, a buffer supply circuit according to the prior art is shown. The input VPATDEN signal is coupled to an input terminal of inverting amplifier, to a first input terminal of NOR gate 211, and to a first input terminal of NAND gate 209. The output terminal of inverting amplifier 201 is coupled through delay line 203 to an input terminal of delay line 205 and to an input terminal of inverting amplifier 215. The output terminal of delay line 205 is coupled through inverting amplifier 207 to a second input terminal of AND gate 209 and to a second input terminal of NOR gate 211. The output terminal of NOR gate 211 is coupled to the substrate through equivalent diode 227 and to a first terminal of capacitor 213. The second terminal of capacitor 213 is coupled through diode-coupled n-channel transistor 231 to the Vs terminal, to the gate and a first terminal of n-channel transistor 237, to a gate of n-channel transistor 239, and to a gate terminal of n-channel transistor 225. A second terminal of transistor 237 is coupled to a first terminal and a gate of n-channel transistor 235. A second terminal of transistor 235 is coupled to a gate and a first terminal of n-channel transistor 233. A second terminal of transistor 233 is coupled to the Vs terminal. The output terminal of inverting amplifier 219 is coupled to the substrate by equivalent diode 221 and to a first terminal of capacitor 223. The output terminal of inverting amplifier 215 is coupled through inverting amplifier 217 to a gate terminal of n-channel transistor 241 and to a gate terminal of p-channel transistor 243. A first terminal of transistor 241 is coupled to ground, while a second terminal of transistor 241 is coupled to a first terminal of transistor 243, to a first terminal of capacitor 245 and to the substrate through equivalent diode 229. A second terminal of transistor 243 is coupled to the Vs terminal. A second terminal of capacitor 223 is coupled to a first terminal of transistor 225, to a first terminal of n-channel transistor 249, and to a gate terminal of transistor 247. A second terminal of transistor 225 is coupled to the Vs terminal. A second terminal of capacitor 245 is coupled to a first terminal of transistor 239, to a first terminal of transistor 247, and to a second terminal of transistor 249. A second terminal of transistor 239 is coupled to the Vs terminal. the second terminal of transistor 247 and the gate terminal of transistor 249 are coupled to the Vpp terminal.

The operation of the buffer supply unit of FIG. 2 can be understood as follows. When the output terminal of NOR gate 211 is low, the diode coupled transistor charges the node of the circuit which includes the gate terminal of transistor 239. When, in response to a change in the VPATDEN signal, the output terminal of NOR gate 211 is driven high, the increase in voltage at the gate terminal of transistor 239 causes transistor 239 to become conducting and the pump capacitor 245 is precharged. When, in response to a change in the UPATDEN signal, the output terminal of NOR gate 211 is driven low, the conduction of transistor 239 ceases because of the change in the voltage at the gate terminal of transistor 239. As before, when the output terminal of NOR gate 211 is low, the circuit node which includes the gate terminal of transistor 239 begins to charge. When the output terminal of NOR gate 211 is driven low, the node wherein transistor 241 and 243 are coupled is driven high (i.e., in response to a change in the UPATDEN signal). Simultaneously, with the high state of the transistor 241/245 node, the output terminal of inverting amplifier 219 is driven high, causing the pass transistor 247 to become conducting. The combination of conduction of the pass transistor 247 and the high state of the transistor 241/243 node causes charge to flow from the capacitor to the Vpp terminal. When the VPATDEN signal causes the NOR gate to be in a high state, capacitor 245 is once again is precharged. The change in the state of the VPATDEN signal results in a change in the state of the output terminal of inverting amplifier 219 causing transistor 247 to stop conduction. The change in state of the UPATDEN signal causes the transistor 241/243 node to be in a low state assisting the precharging of capacitor 245.

In the prior art, the solution to the problem of a variable configuration, discussed previously, requires different Vpp voltage levels for the one output buffer and the four output buffer configuration as well as an unnecessarily high power consumption for the one output buffer configuration. A need has therefore been felt for apparatus and an associated technique which provides a pumping capacitor not requiring different power supply levels for the one output buffer and the four output buffer configurations and which does not require unnecessary power for activating the one output buffer configuration.

SUMMARY OF THE INVENTION

The aforementioned and other features are provided, according to the present invention, by a variable capacitor implementation in which the size of the pumping capacitor is determined by the output buffer configuration. The size of the pumping capacitor is a first value when the only one output buffer is utilized and a second value (i.e., four times as large) when all four output buffers are in the configuration. The buffer power supply includes two charge pump circuits. The first charge pump circuit is always enabled and has a pump capacitance appropriate to the buffer configuration which is being supplied. The second charge pump circuit, activated by an external control signal, operates simultaneously with the first charge pump circuit and supplies charge to the same output terminal. The second charge pump circuit has a capacitance appropriate for the increased buffer configuration, the configuration for which the second charge pump circuit was designed.

These and other features of the present invention will be understood upon reading of the following description along with the Figures.

DESCRIPTION OF THE PREFERRED EMBODIMENT(S)

Figure 1:
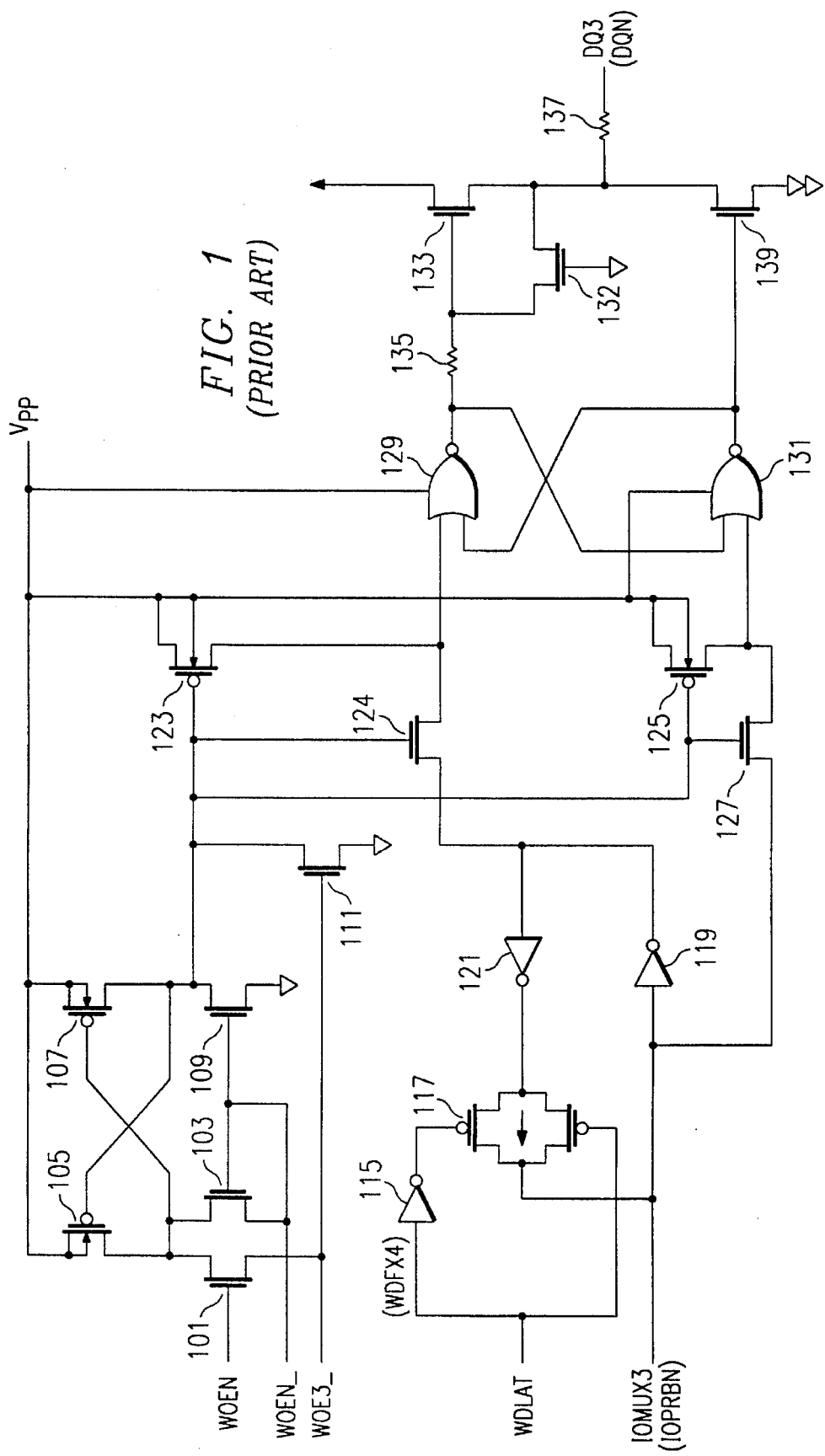
FIG. 1 is a schematic diagram of a typical n-channel output buffer circuit capable of being used advantageously with the present invention.

1. Detailed Description of the Drawings FIG. 1 and FIG. 2 have been described in relation to the prior art.

Figure 3:
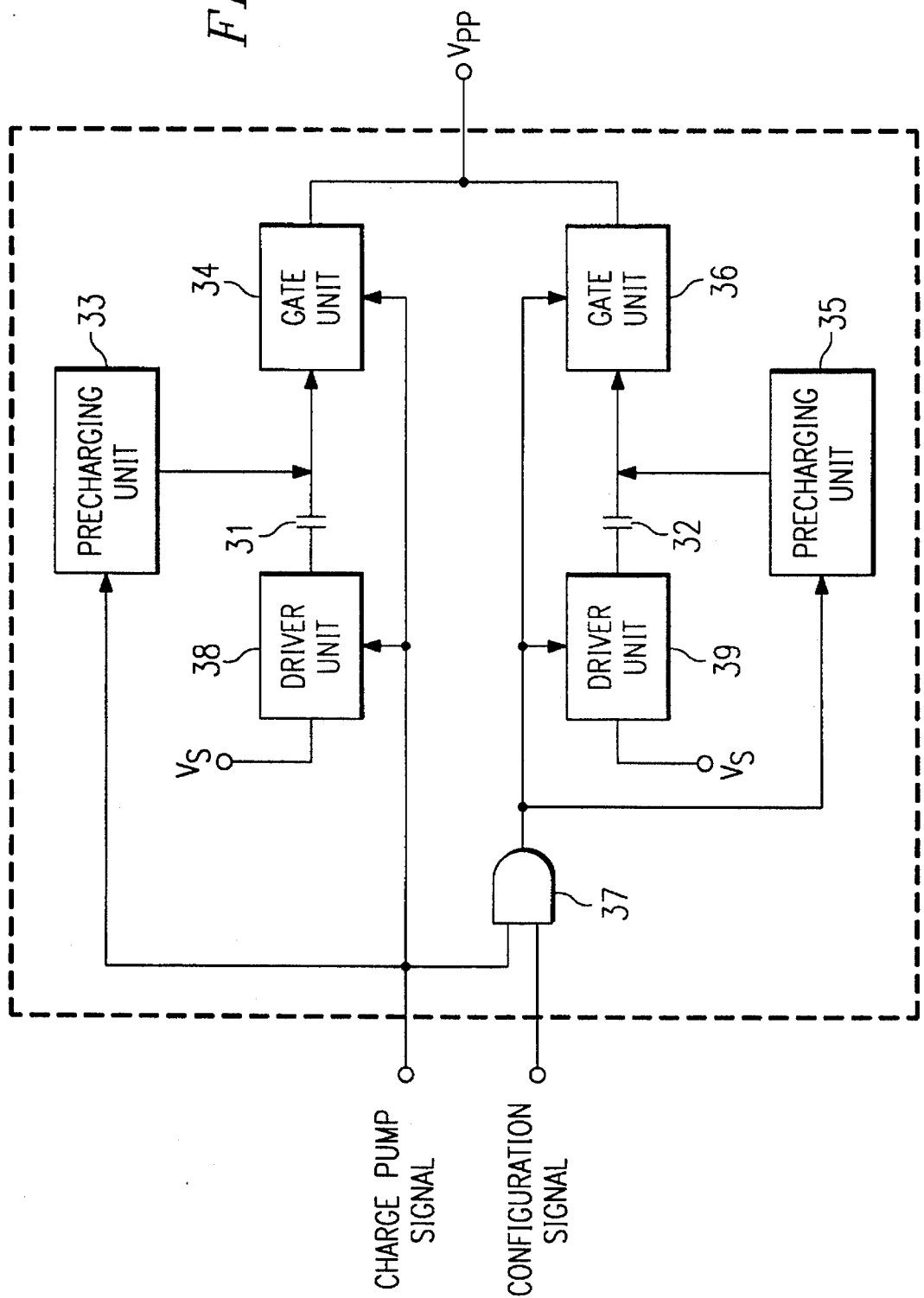
FIG. 3 is a block diagram of a buffer supply circuit according to the present invention.

Referring next to FIG. 3, a block diagram of the buffer supply circuit according to the present invention is illustrated. A CHARGE PUMP signal is applied to one input terminal of AND gate 37, to a driver unit 38, to precharging unit 33, and to gate unit 34. Capacitor 31 has one terminal coupled through driver circuit 38 to supply terminal Vs. The second terminal of capacitor 31 receives charge from precharging unit 33 and applies a signal to gate 34. A CONFIGURATION signal is applied to a second terminal of AND gate 37. The output signal from AND gate 37 is applied to gate unit 36, to driver unit 39 and to precharging unit 35. Capacitor 32 has one terminal coupled through driver unit 39 to voltage supply Vs. A second terminal of capacitor 32 receives charge from precharging unit 35 and applies a signal to gate unit 36. Output signals from gate unit 34 and gate unit 36 are applied to the Vpp voltage terminal.

Figure 4:
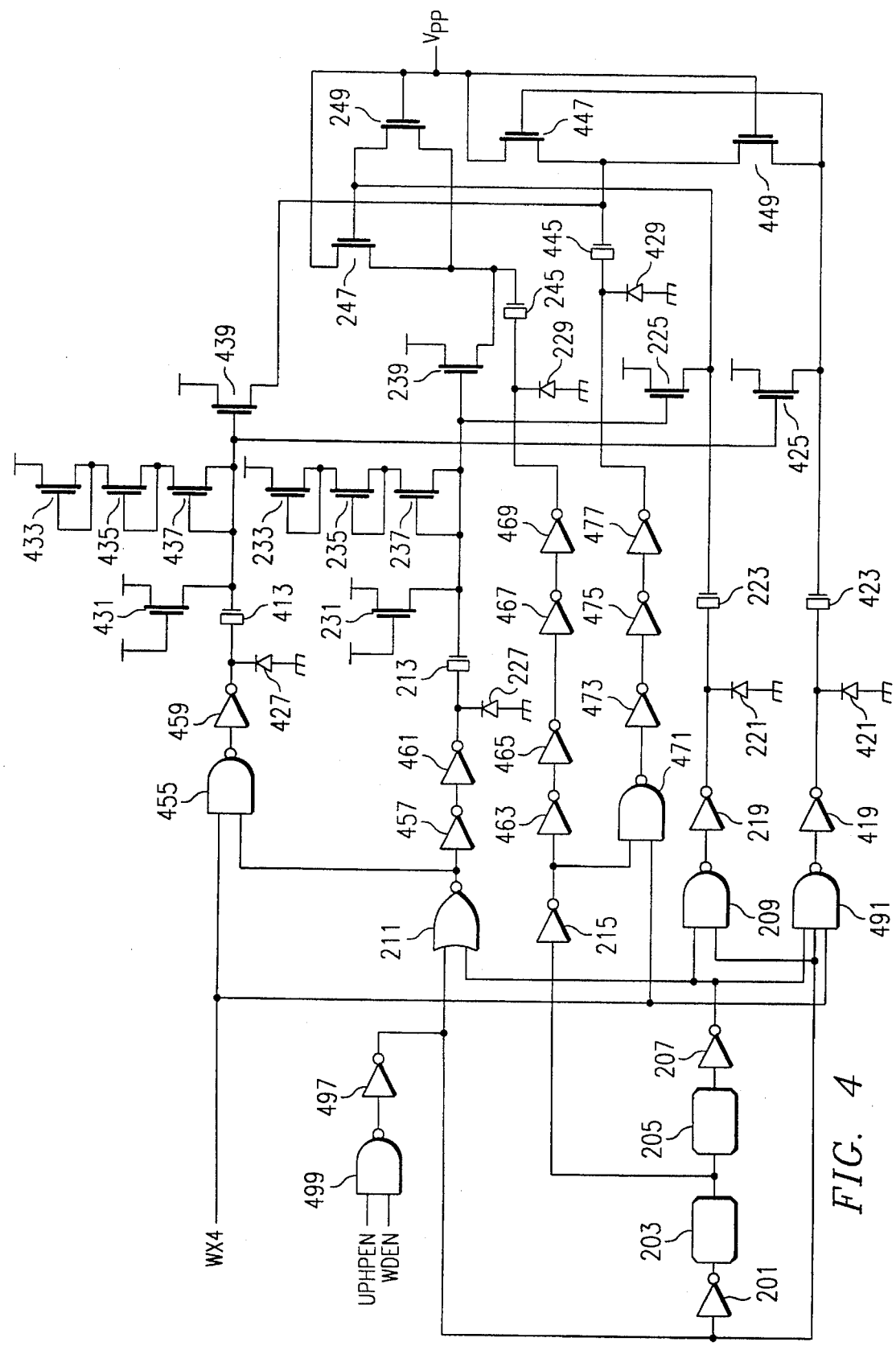
FIG. 4 is a schematic diagram of a buffer supply circuit according to the present invention.

Referring to FIG. 4 a schematic diagram of the buffer supply circuit according to the present invention. The circuit consists of two parallel circuits, each generally similar in layout and in operation to the buffer supply shown in FIG. 2. To emphasize this similarity, in FIG. 4, the elements which serve essentially the same function as in FIG. 2 for the first of the parallel circuits are provided with the same numbers. For the second parallel circuit, the elements which serve the same function as those in the first parallel circuit have the same two last numbers. The function of the additional elements can be understood as follows. The NAND gate 499, which receives the WOEN signal and the VPHEN signal, and the inverter amplifier 497 provide the VPATDEN signal, the input signal which activates the buffer supply circuit. The NAND gate 491 is added to provide controllable activation of the pass gate transistor 447. Similarly, the NAND gate 471 along with inverting amplifiers 473, 475, and 477 provides for controllable activation of the "pumping" action with respect to capacitor 445. (Inverting amplifiers 463, 465, 467, and 468 provide compensation, e.g. time delay and buffering, to "pumping" action with respect to capacitor 245.) NAND gate 455 and inverting amplifier 459 provide for controllable activation of the precharging of capacitor 445 relative to the precharging of capacitor 245. (The inverting amplifiers 457 and 461 provide compensation, e.g., time delay and buffering, for the NAND gate 455 and the inverting amplifier 459.) The gate terminal of transistor 439 is coupled to the gate terminal of transistor 425. The gate terminal of transistor 239 is coupled to the gate terminal of transistor 225.

2. Operation of the Preferred Embodiment(s)

Figure 2:
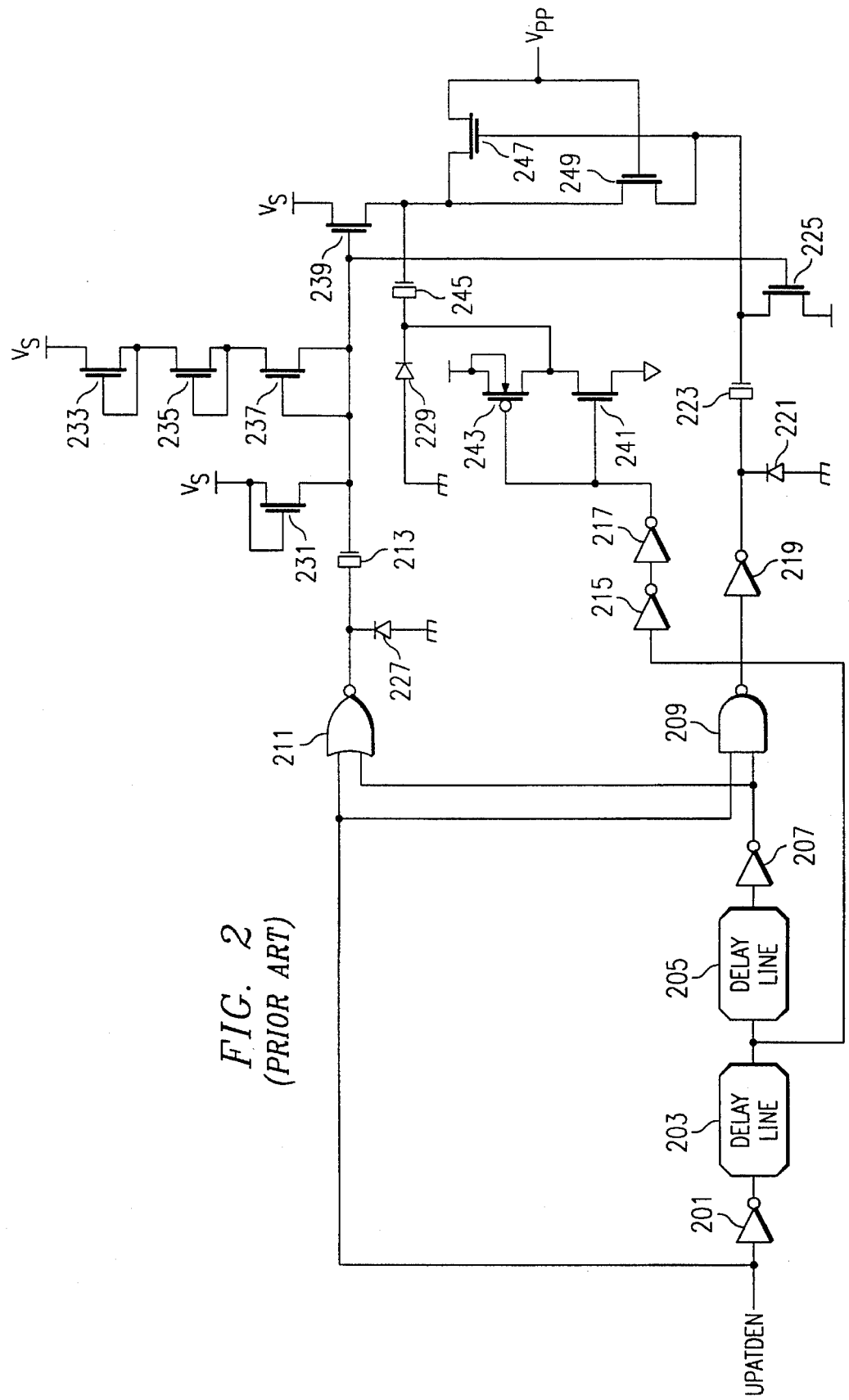
FIG. 2 is a schematic diagram of the buffer supply circuit according to the prior art.

The buffer supply, as indicated above, includes two charge pump circuits that operate in essentially the same manner, i.e., as described in relationship to FIG. 2. In the present invention, one of the circuits is always operating in response to an input signal. The second circuit is rendered inactive unless an appropriate control signal is applied to the buffer supply. In the presence of the activating control signal, the second charge pump circuit operates in synchronism with the first charge pump circuit. The value of each pump capacitance (245 and 445) is chosen so that the proper amount of charge is applied to the configuration of buffer amplifiers. Thus, the present buffer supply circuit is more efficient because the pump capacitance in each configuration is appropriate for that configuration.

While the present invention finds its most obvious application in the form of memory circuits with various output buffer amplifier configurations, the present invention is applicable to any circuit, such a microprocessor, which can have output buffer amplifiers in a plurality of configurations. The principal requirement is that the buffer amplifier require a Vpp power supply of the form suitable for use with a pull-up transistor and pull down transistor output stage.

In the preferred embodiment, the WX4 signal (shown in FIG. 4) which reconfigures the buffer supply to be consistent with number of buffer amplifiers is provided by bond pad option during fabrication of the device. Thereafter, the configuration of the buffer supply is fixed. It will be clear however, that the WX4 signal can be provided to the buffer supply in a such a manner as to make the buffer supply dynamically alterable.

While the invention has been described with particular reference to the preferred embodiment, it will be understood by those skilled in the art that various changes may be made and equivalents substituted for elements of the preferred embodiment without departing from the invention. For example, the present invention has been described with particular reference to two configurations (or number) of buffer amplifiers. In fact, the invention can be expanded to include more than two configurations or more than two numbers of buffer amplifier. In addition, many modifications can be made to adapt a particular situation and material to a teaching of the invention without departing from the essential teachings of the present invention.

As is evident from the foregoing discussion, certain aspects of the invention are not limited to the particular details of examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A buffer supply circuit for energizing a buffer amplifier array having a first group and a second group of buffer amplifiers; said circuit comprising:

a control signal indicative of said first group and said second group being coupled to said buffer supply circuit;

a first charge pump circuit responsive to a first input signal, said first charge pump circuit having a first pump capacitor selected for use with said first group of said buffer amplifiers; and a second charge pump circuit partially integrated with said first charge pump and activated by said first input signal and by said control signal; an output of said second charge pump circuit being coupled to an output of said first charge pump circuit, said second charge pump circuit having second capacitor selected for use with said second group of said buffer amplifiers.

2. The circuit of claim 1 wherein said first charge pump circuit includes a first precharging unit, a pass gate unit, and a driver unit; said second charge pump circuit including a second precharging unit, a second pass gate unit, and a second driver unit, wherein said second precharging unit, said second pass gate unit, and said second driver unit are activated by said control signal.

3. A method of supplying charge to a plurality of buffer amplifier configurations, said method comprising the steps of:

dividing said plurality of amplifiers into a first and a second group;

generating a control signal when said first and said second group are coupled together;

when charge is being supplied to said first group of buffer amplifiers, supplying said first group charge with a first charge pump circuit having a pump capacitor selected to charge said first group;

when charge is being supplied to said second group of buffer amplifiers, supplying said second group charge with said first charge pump and a second charge pump partially integrated with said first charge pump, said second charge pump having a second charge pump capacitor, said second charge pump capacitor selected to charge said second group.

4. The method of claim 3 further including the step of activating said second charge pump circuit with an externally applied control signal.

5. The method of claim 4 further including the step of operating said first and said second charge pump simultaneously in response to a common input signal.

6. A buffer supply circuit for energizing a plurality of configurations of buffer amplifiers, said circuit comprising:

a first charge pump circuit, said first charge pump circuit operating in response to a first input signal, said first charge pump for energizing a first group of buffer amplifiers; and a second charge pump circuit partially integrated with said first charge pump, said second charge pump activated in response to a first control signal, said second charge pump circuit operating in response to said first input signal, said first and said second charge pump circuits for energizing a second group of buffer amplifiers, wherein said first control signal indicates that both said groups are coupled to said buffer supply circuit.

7. The buffer supply circuit of claim 6 wherein said buffer supply circuit is used with buffer amplifiers having n-channel pull-up and n-channel pull-down resistors in an output stage of said buffer amplifier.

8. The buffer supply circuit of claim 6 wherein said second charge pump circuit includes a second pump capacitor, a second precharging unit, a second driver unit, and a second pass gate unit, wherein said second precharging unit, said second driver unit, and said second pass gate unit are each enabled by said control signal.

9. The buffer circuit of claim 8 wherein parameters of said first pump capacitor are selected in response to parameters of said first group, and wherein said second pump capacitor is selected in response to parameters of said first pump capacitor and said second buffer amplifier group.

\* \* \* \* \*